US010073427B2

(12) United States Patent
Hirota et al.

(10) Patent No.: US 10,073,427 B2
(45) Date of Patent: Sep. 11, 2018

(54) OPERATION DETECTING DEVICE OF OPENING AND CLOSING BODY FOR VEHICLE

(71) Applicant: AISIN SEIKI KABUSHIKI KAISHA, Kariya-shi (JP)

(72) Inventors: Koichi Hirota, Takahama (JP); Takaya Aiyama, Anjo (JP); Hitoshi Takayanagi, Kariya (JP)

(73) Assignee: AISIN SEIKI KABUSHIKI KAISHA, Kariya-shi (JP)

(*) Notice: Subject to any disclaimer, the term of this patent is extended or adjusted under 35 U.S.C. 154(b) by 362 days.

(21) Appl. No.: 14/945,997

(22) Filed: Nov. 19, 2015

(65) Prior Publication Data

US 2016/0139579 A1    May 19, 2016

(30) Foreign Application Priority Data

Nov. 19, 2014 (JP) .................................. 2014-234143

(51) Int. Cl.
*G01M 1/38* (2006.01)
*G05B 19/042* (2006.01)
(Continued)

(52) U.S. Cl.
CPC ............ *G05B 19/042* (2013.01); *E05F 15/46* (2015.01); *E05F 15/73* (2015.01);
(Continued)

(58) Field of Classification Search
CPC ........... G05B 19/042; G05B 2219/2637; E05F 15/46; E05F 15/73; E05Y 2800/73; E05Y 2900/50; H03K 17/9622
(Continued)

(56) References Cited

U.S. PATENT DOCUMENTS

| 7,109,853    B1* | 9/2006 | Mattson ................. B60R 99/00 236/94 |
| 2003/0102688 A1* | 6/2003 | Bingle .................... E05B 83/26 296/76 |

(Continued)

FOREIGN PATENT DOCUMENTS

| EP | 2 787 157 A1    | 10/2014 |
| JP | 2011-252881     | 12/2011 |
| WO | WO 2013/033735 A1 | 3/2013 |

OTHER PUBLICATIONS

Extended European Search Report dated Mar. 24, 2016 in European Patent Application No. 15195156.3.
U.S. Appl. No. 14/945,821, filed Nov. 19, 2015, Hirota, et al.
U.S. Appl. No. 14/945,834, filed Nov. 19, 2015, Tsuji, et al.

*Primary Examiner* — Long K Tran
(74) *Attorney, Agent, or Firm* — Oblon, McClelland, Maier & Neustadt, L.L.P.

(57) ABSTRACT

An operation detecting device of an opening and closing body for a vehicle, includes: a detecting section that detects an operation by a user with respect to an opening and closing body of a vehicle; an input section that receives an opening and closing body motion signal which indicates whether or not the opening and closing body is in motion or idle; a determination section that determines whether or not the operation is performed using different detection conditions for a case in which the opening and closing body is in motion and a case in which the opening and closing body is idle; and an output section that outputs a control signal which causes the opening and closing body to move or stop based on the determination result of the determination section.

4 Claims, 10 Drawing Sheets

(51) Int. Cl.
*H03K 17/96* (2006.01)
*E05F 15/73* (2015.01)
*E05F 15/46* (2015.01)
*B60R 25/20* (2013.01)

(52) U.S. Cl.
CPC ...... *H03K 17/9622* (2013.01); *B60R 25/2045* (2013.01); *E05Y 2800/73* (2013.01); *E05Y 2900/50* (2013.01); *G05B 2219/2637* (2013.01)

(58) Field of Classification Search
USPC ........................................................ 700/275
See application file for complete search history.

(56) References Cited

U.S. PATENT DOCUMENTS

| | | | |
|---|---|---|---|
| 2004/0227625 A1 | 11/2004 | Joehl et al. | |
| 2006/0208169 A1* | 9/2006 | Breed .................... | B60N 2/002 250/221 |
| 2013/0187889 A1 | 7/2013 | Pandher et al. | |
| 2014/0292396 A1 | 10/2014 | Bruwer et al. | |
| 2014/0303852 A1 | 10/2014 | Seki et al. | |
| 2014/0374232 A1* | 12/2014 | Hanada .................. | H01H 9/161 200/600 |
| 2015/0084317 A1* | 3/2015 | Togura .................. | B60R 21/015 280/735 |
| 2016/0087629 A1* | 3/2016 | Nishiyama ........... | H03K 17/955 200/17 R |

* cited by examiner

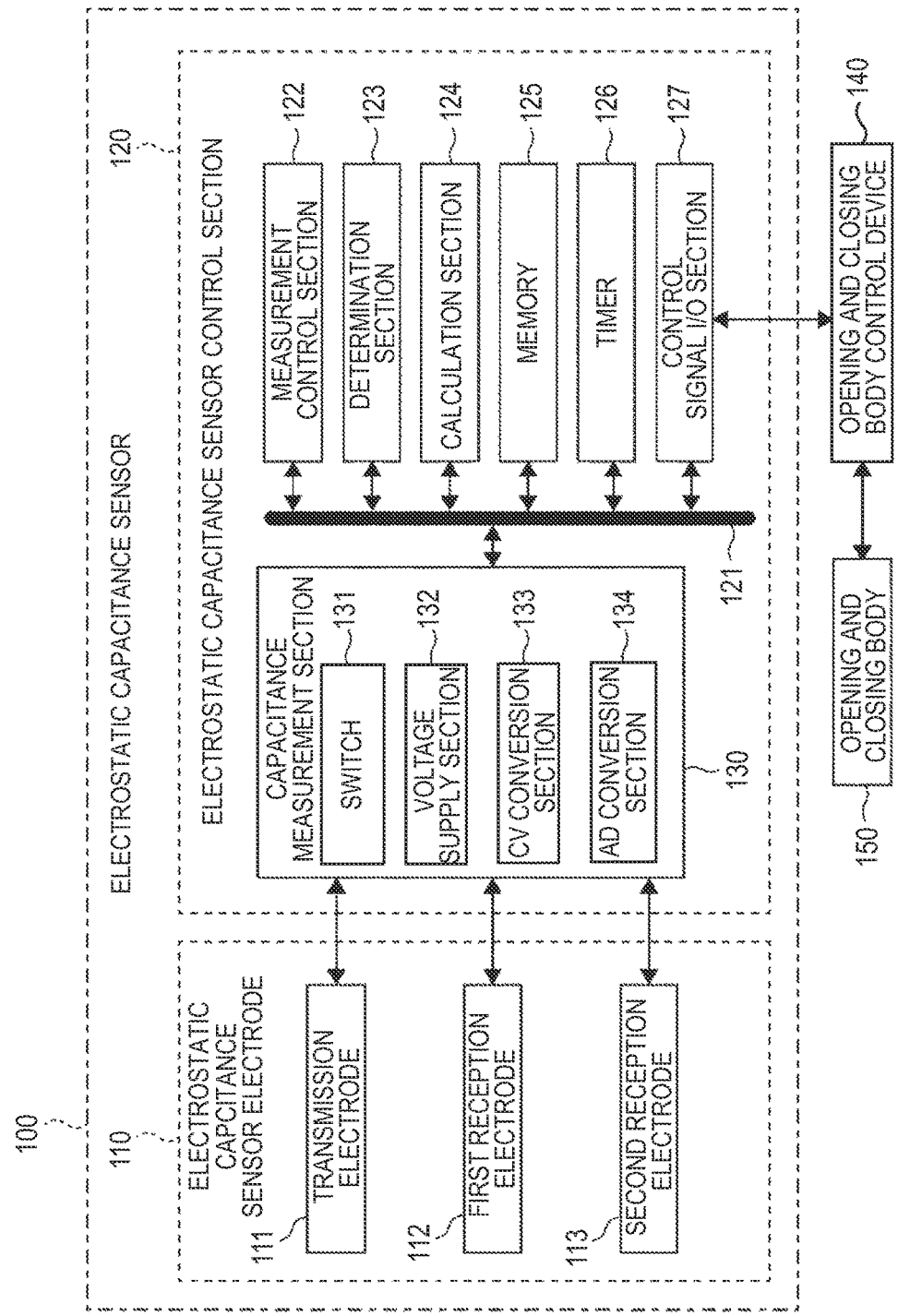

OPERATION DETECTING DEVICE OF OPENING AND CLOSING BODY FOR VEHICLE

CROSS REFERENCE TO RELATED APPLICATIONS

This application is based on and claims priority under 35 U.S.C. § 119 to Japanese Patent Application 2014-234143, filed on Nov. 19, 2014, the entire contents of which are incorporated herein by reference.

TECHNICAL FIELD

This disclosure relates to an operation detecting device of an opening and closing body for a vehicle.

BACKGROUND DISCUSSION

An electrostatic capacitance sensor which detects the position or the motion of a detection object based on a change of an electrostatic capacitance is known. The electrostatic capacitance sensor includes one or multiple electrodes for detecting. When the detection object approaches the electrodes for detecting, a capacitance value of the electrostatic capacitance generated between the electrodes or between the electrode and a ground is changed. The electrostatic capacitance sensor is a device which detects a motion of the detection object by measuring a change of capacitance value as an electrical signal.

In JP 2011-252881A (Reference 1), a sensor module for controlling an automatic door is disclosed which makes the automatic door opened when a motion of a detection target body (user's hand, or the like) detected by the electrostatic capacitance sensor coincides with a predetermined motion pattern.

The electrostatic capacitance sensor described above can be used for an operation of detecting an opening and closing body for a vehicle (sliding door, back door, or the like) supporting to automatic opening and closing. Such an opening and closing body for a vehicle performs an opening and closing operation or is stopped by an operation of the user. Accordingly, the user may perform the operation while the opening and closing body is in motion. For example, it is assumed that an operation for emergency stop should be performed when an object is about to be caught in the opening and closing body, or when the opening and closing body is about to hit a wall. When a sensor module disclosed in Reference 1 which detects the motion of the detection target body is applied to the opening and closing body for a vehicle supporting to such an operation, there is a problem in that an operation procedure is complicated and the operation takes a long time. For this reason, there is a case in which the operation for emergency stop cannot be performed in a short time while the opening and closing body is in motion.

SUMMARY

Thus, a need exists for an operation detecting device of an opening and closing body for a vehicle which is not suspectable to the drawback mentioned above.

An aspect of this disclosure provides an operation detecting device of an opening and closing body for a vehicle including a detecting section that detects an operation by a user with respect to an opening and closing body of a vehicle, an input section that receives an opening and closing body motion signal which indicates whether the opening and closing body is in motion or idle, a determination section that determines whether the operation is performed using different detection conditions for a case in which the opening and closing body is in motion and a case in which the opening and closing body is idle, and an output section that outputs a control signal which causes the opening and closing body to move or stop based on the determination result of the determination section.

BRIEF DESCRIPTION OF THE DRAWINGS

The foregoing and additional features and characteristics of this disclosure will become more apparent from the following detailed description considered with the reference to the accompanying drawings, wherein:

FIG. 1A is a block diagram illustrating a configuration of an electrostatic capacitance sensor of an opening and closing body for a vehicle according to a first embodiment;

DETAILED DESCRIPTION

Figure 1B:
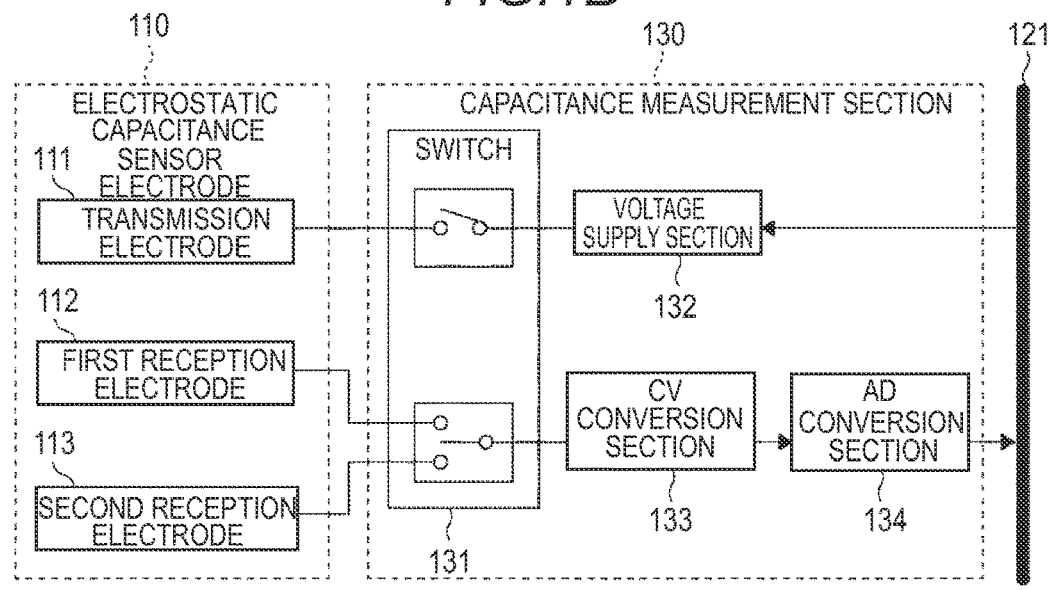
FIG. 1B is a block diagram illustrating a configuration of a capacitance measurement section of the opening and closing body for a vehicle according to the first embodiment.

Hereinafter, exemplified embodiments will be described in detail with reference to drawings. However, as long as there is no particular description, the scope of this disclosure is not limited to aspects which are specifically disclosed as the embodiments to be described below. Also, in drawings to be described below, components having the same functions are given the same numerals, and description thereof will not be repeated.

First Embodiment

FIG. 1A is a block diagram illustrating a configuration of an operation detecting device of an opening and closing body for a vehicle according to a first embodiment disclosed here. An electrostatic capacitance sensor 100, which is the operation detecting device of the opening and closing body for a vehicle, includes an electrostatic capacitance sensor electrode 110 and an electrostatic capacitance sensor control section 120. The electrostatic capacitance sensor electrode 110 is a detecting section of the electrostatic capacitance sensor 100 for detecting an operation on the opening and closing body of a vehicle by a user. The electrostatic capacitance sensor control section 120 is a component which controls an operation of the electrostatic capacitance sensor electrode 110 and outputs a detection result of the electrostatic capacitance sensor electrode 110 to an opening and closing body control device 140.

The electrostatic capacitance sensor 100 of the embodiment disclosed here is a mutual capacitance type electrostatic capacitance sensor. The electrostatic capacitance sensor electrode 110 includes a transmission electrode 111, a first reception electrode 112, and a second reception electrode 113. The transmission electrode 111 is an electrode which generates an electric force line by applying a voltage, and the first reception electrode 112 and the second reception electrode 113 are electrodes which receive the electric force line. Accordingly, an electrostatic capacitance is generated between the transmission electrode 111 and the first reception electrode 112, and between the transmission electrode 111 and the second reception electrode 113. The electrostatic capacitance sensor 100 of the embodiment measures the change of the electrostatic capacitance, and thus it detects whether a detection object such as a user's hand approaches or retreats therefrom.

The electrostatic capacitance sensor electrode 110 can be operated by the user, and can be provided at an arbitrary position of a vehicle where the electric force line is not shielded by a conductor. For example, the electrostatic capacitance sensor electrode 110 can be provided on a door handle, a center pillar (a pillar is provided between a front seat and a rear seat, at a side of a vehicle), a center pillar garnish, a belt molding, the rear side of an emblem, a back door garnish, a bumper, and the like. The electrostatic capacitance sensor electrode 110 may be provided on a movable member of an opening and closing body 150 of the vehicle, or may be provided on other parts. Further, when a partial of a member constituting the opening and closing body is not made of a metal, the electrostatic capacitance sensor electrode may be provided inside of a part, which is not made of a metal.

The electrostatic capacitance sensor control section 120 includes a bus 121, a measurement control section 122, a determination section 123, a calculation section 124, a memory 125, a timer 126, a control signal inputting and outputting section 127, and a capacitance measurement section 130. The bus 121 is a wire which connects sections of the electrostatic capacitance sensor control section 120 to each other. The capacitance measurement section 130 is a part which measures the electrostatic capacitance between the electrodes of the electrostatic capacitance sensor electrode 110.

The control signal inputting and outputting section 127 is an interface which transmits and receives signals between the electrostatic capacitance sensor control section 120 and the opening and closing body control device 140. The control signal inputting and outputting section 127 functions as an output section which outputs a signal, which relates to an operation by the user, such as whether the user operates or does not operate using the electrostatic capacitance sensor electrode 110, to the opening and closing body control device 140. Further, the control signal inputting and outputting section 127 functions as an input section which receives an opening and closing motion signal indicating a state (opened state or closed state) of the opening and closing body 150 from the opening and closing body control device 140.

The opening and closing body control device 140 is an electronic control section (ECU) which is mounted on, for example, a vehicle, and controls an opening and closing motion of the opening and closing body 150 based on a signal related to a user's operation input through the control signal inputting and outputting section 127 of the electrostatic capacitance sensor control section 120. The opening and closing body 150 is an opening and closing body of a vehicle, which can automatically perform the opening and closing motion using a power source such as a motor. More specifically, the opening and closing body 150 can include a sliding door, a sun roof, a back door, a power window, and a swing door. In the opening and closing body 150, a sensor which detects a motion state of the power source is provided. For example, the opening and closing body 150 can include a pulse sensor in which a hole element is used as a sensor which detects a rotation of the motor. A signal of the sensor is output from the opening and closing body 150 to the opening and closing body control device 140, and input to the determination section 123 through the control signal inputting and outputting section 127 of the electrostatic capacitance sensor control section 120. Also, the signal output form the sensor is temporarily stored in the memory 125 without directly being input to the determination section 123, and then may be read by the determination section 123.

The measurement control section 122 is a part for controlling a measurement state of the capacitance measurement section 130. For example, a connection state of a switch 131 is switched due to an output signal from the measurement control section 122. Accordingly, a measurement using the first reception electrode 112 and a measurement using the second reception electrode 113 can be switched therebetween.

The memory 125 is a storage medium which is constituted by a ROM, a RAM, or the like, and temporarily or permanently stores data, such as an output value from the capacitance measurement section 130, a timing or a time output from the timer 126, and a state of the opening and closing body 150 output from the opening and closing body control device 140. The memory 125 supplies the data stored according to an instruction of the determination section 123 and the calculation section 124. The timer 126 is a part which supplies time information to each section, or the like.

The determination section 123 is part which determines whether or not the user performs a normal operation based on the output value stored in the memory 125 and output from the capacitance measurement section 130. The normal operation is a predetermined operation order, which is performed at the time of getting an intention in which the user desires to perform an opening and closing motion of the opening and closing body 150.

The calculation section 124 is a part which performs various calculations for data processing such as reduction of noise or removing an offset, with respect to the output signal indicating a capacitance value output from the capacitance measurement section 130.

FIG. 1B is a block diagram illustrating a configuration of the capacitance measurement section of the opening and closing body of a vehicle according to the first embodiment. The capacitance measurement section 130 includes a switch 131, a voltage supply section 132, a capacitance-to-voltage (CV) conversion section 133, and an analog-to-digital (AD) conversion section 134.

The voltage supply section 132 is a part which supplies a voltage for outputting the electric force line to the transmission electrode 111, in response to a control signal input from the measurement control section 122 through the bus 121. The voltage supply section 132 may include a voltage conversion circuit and an amplifying circuit in order to adjust a voltage being supplied to the transmission electrode 111.

The switch 131 is a part which switches connection of each electrode for measuring the capacitance. The switch 131 includes a switching part, which performs turning on and off, between the transmission electrode 111 and the voltage supply section 132. In addition, the switch 131 includes a switching part for switching connection between the CV conversion section 133 and the first reception electrode 112, or between the CV conversion section 133 and the second reception electrode 113.

The CV conversion section 133 is a CV conversion circuit which converts and outputs an electrostatic capacitance between the transmission electrode 111 and the first reception electrode 112 and the electrostatic capacitance between the transmission electrode 111 and the second reception electrode 113 to a voltage value. The CV conversion section 133 may include an amplifier for varying an output voltage at the time of CV conversion.

The AD conversion section 134 is an AD conversion circuit which converts and outputs a voltage value output from the CV conversion section 133 as an analog signal to a digital signal. The digital signal, which is output from the AD conversion section 134 and indicates the capacitance value, is stored in the memory 125 through the bus 121.

Moreover, in the embodiment, the capacitance measurement section 130 includes a circuit which measures the electrostatic capacitance using a CV conversion circuit; however, the measurement of the electrostatic capacitance may be performed using other methods. For example, a measurement method of the electrostatic capacitance using various circuits such as a circuit that repeatedly transmits charges to a reference capacitance element and counts the number of times of the transmission, and a CR resonance circuit, can be used.

One or a plurality of functional parts according to the embodiment disclosed here illustrated in FIG. 1A and FIG. 1B may be provided as hardware or may be provided as a program which is carried out by the hardware of a computer including a central processing section (CPU). Such a program can be stored in the memory 125.

Figure 2A:
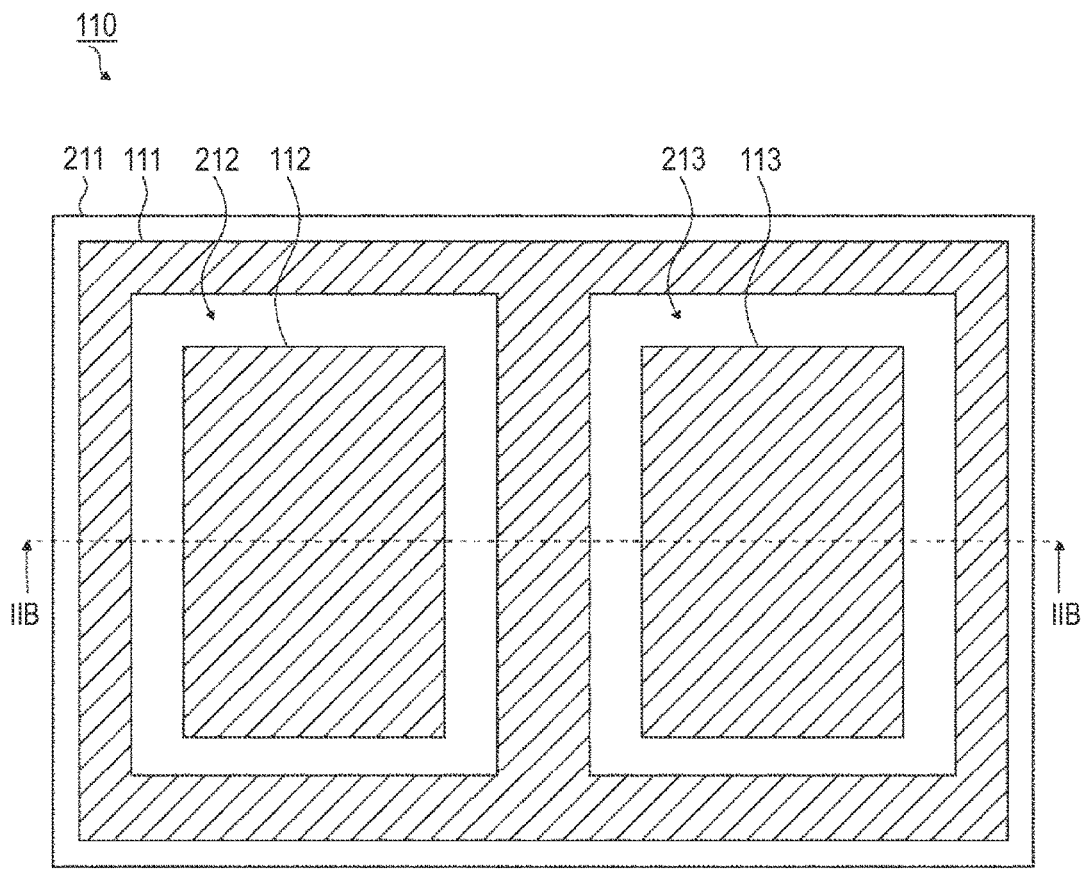
FIG. 2A is a view illustrating a configuration of an electrostatic capacitance sensor electrode according to the first embodiment.
Figure 2B:
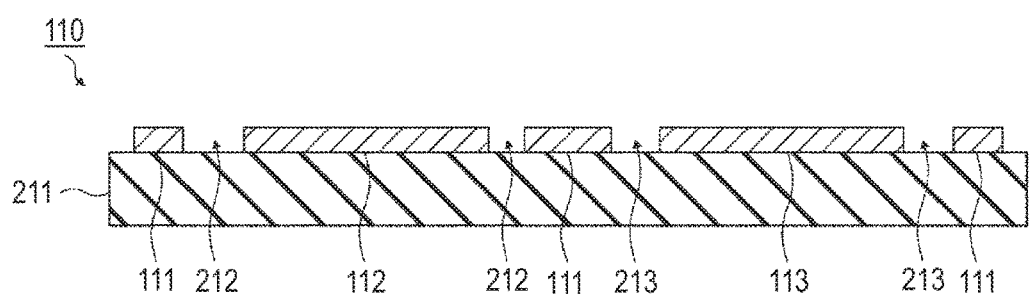
FIG. 2B is a sectional view taken along the line IIB-IIB, which illustrates the electrostatic capacitance sensor electrode according to the first embodiment.

FIG. 2A is a view illustrating a configuration of the electrostatic capacitance sensor electrode 110 according to the first embodiment. In addition, FIG. 2B is a sectional view taken along the line IIB-IIB, which illustrates the electrostatic capacitance sensor electrode, according to the first embodiment. The transmission electrode 111, the first reception electrode 112, and the second reception electrode 113 of the electrostatic capacitance sensor electrode 110 are formed on one main surface of a base body 211 of a thin film shape. The base body 211 is made of a high resistance material such as resin, glass, and ceramics, or an insulating material. The first reception electrode 112 is surrounded by the transmission electrode 111 through a gap 212. In the same manner, the second reception electrode 113 is surrounded by the transmission electrode 111 through a gap 213. Also, in the embodiment, the transmission electrode 111 is disposed so as to surround the first reception electrode 112 and the second reception electrode 113; however, it is not necessary, and these electrodes may be disposed to be adjacent each other at a predetermined interval.

Figure 2C:
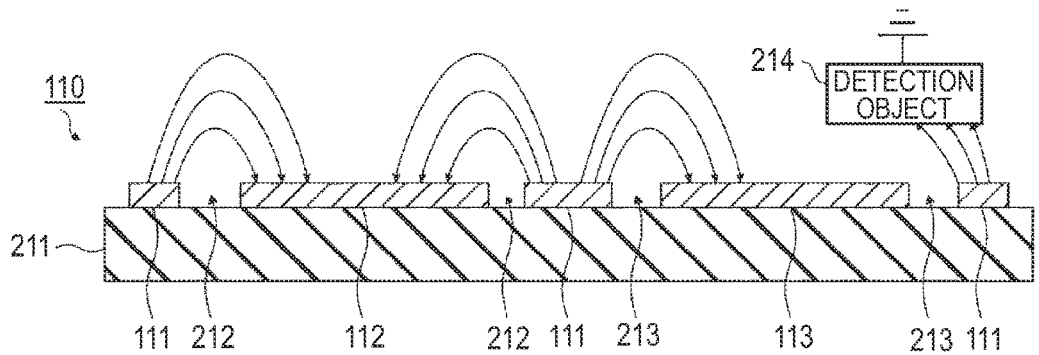
FIG. 2C is a view illustrating a detection of a capacitance change using the electrostatic capacitance sensor electrode according to the first embodiment.

FIG. 2C is a view illustrating a detection of a capacitance change by the electrostatic capacitance sensor electrode 110 according to the first embodiment. When a voltage is applied to the transmission electrode 111, the electric force line is transmitted from the transmission electrode 111. The first reception electrode 112 receives a part of the electric force line transmitted from the transmission electrode 111. Accordingly, the electrostatic capacitance is generated between the transmission electrode 111 and the first reception electrode 112. In the same manner, the electrostatic capacitance is also generated between the transmission electrode 111 and the second reception electrode 113.

FIG. 2C illustrates a distribution of the electric force line in a case in which a detection object 214 having conductivity, such as a human hand, approaches the gap 213 between the transmission electrode 111 and the second reception electrode 113. The detection object 214 functions as an equivalent ground, and the electric force line, which is transmitted from the transmission electrode 111, is shielded by the detection object 214. Accordingly, the electrostatic capacitance between the transmission electrode 111 and the second reception electrode 113 is reduced. The reduction of the electrostatic capacitance is measured using the second reception electrode 113, thereby making it possible to detect the detection object 214 approaching or retreating. The same applies to the case where the detection object 214 approaches the first reception electrode 112. That is, the electrostatic capacitance sensor electrode 110 of the embodiment includes two detection regions, and can be used for a measurement of two channels. Also, in this specification, the detection region means a spatial range where the change of the electrostatic capacitance can be detected at the time of entry of the detection object 214.

However, the number of electrodes and detection regions included in the electrostatic capacitance sensor electrode 110, and a detection manner (mutual capacitance type, self capacitance type, or the like) of the electrostatic capacitance sensor 100 are arbitrary, and can be appropriately changed.

The electrostatic capacitance sensor 100 of the embodiment includes the electrostatic capacitance sensor electrode 110 including a plurality of the electrodes, and is capable of detecting a gesture of the user. For example, it is assumed that a gesture in which the user successively performs "an operation of approaching the hand to the first reception electrode 112" and "an operation of approaching the hand to the second reception electrode 113", is defined as a normal operation for moving the opening and closing body 150. In this case, first, the electrostatic capacitance detected using the first reception electrode 112 is reduced, and then, the electrostatic capacitance using the second reception electrode 113 is reduced. In a case in which a pattern of such a capacitance change is detected, the determination section 123 determines that the normal operation has been performed. Accordingly, the electrostatic capacitance sensor 100 is capable of detecting the gesture of the user. There is a low possibility that a change pattern of the electrostatic capacitance, which is generated in a case in which the electrostatic capacitance sensor electrode 110 becomes wet due to water, a case in which a human passes by the electrostatic capacitance sensor electrode 110, or the like, coincides with the operation by the user by accident. Therefore, when a manner of detecting the gesture is adopted, an erroneous detection due to water wetting, a passing human body, or the like can be reduced.

Figure 3:
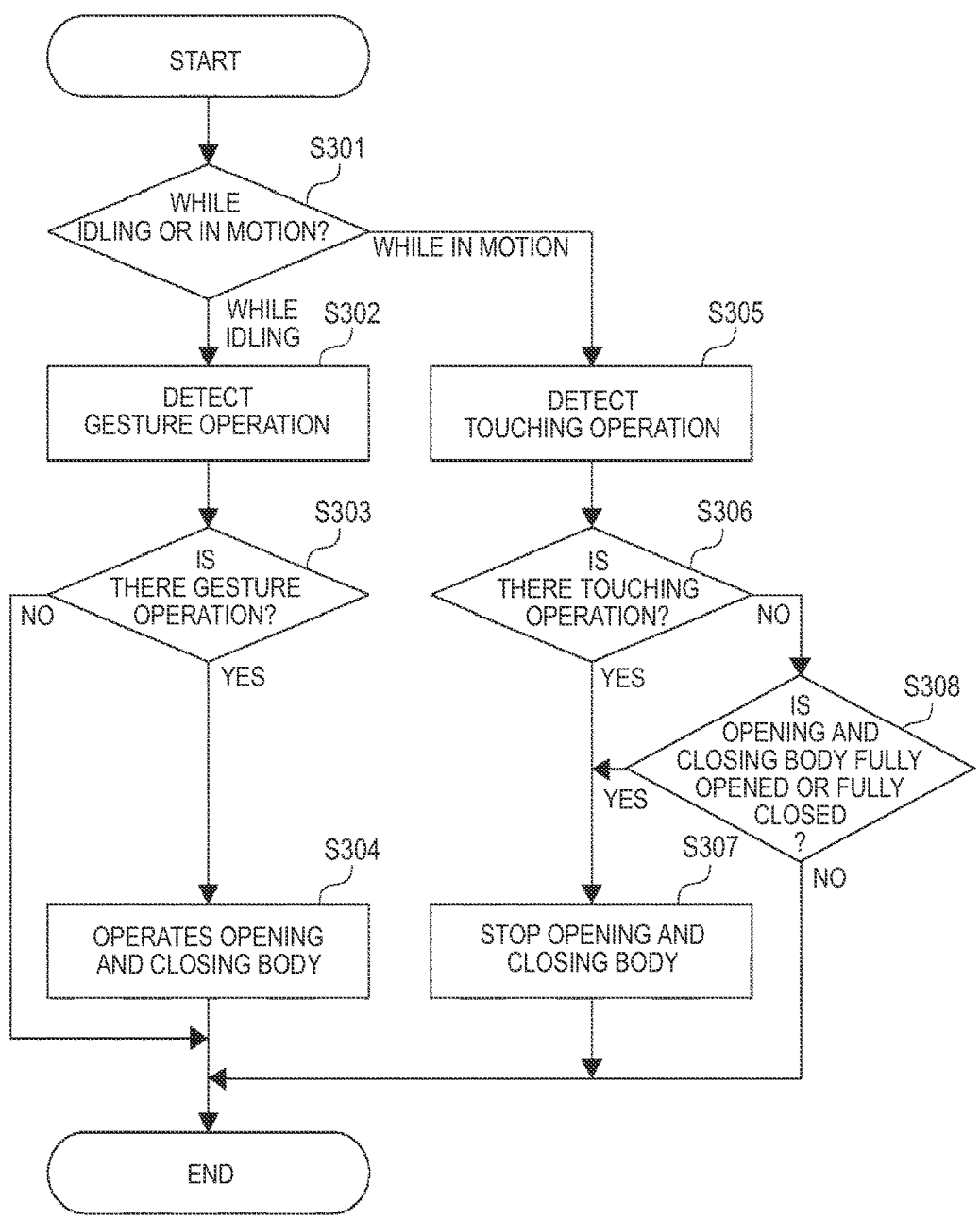
FIG. 3 is a flow chart illustrating a control method of the electrostatic capacitance sensor according to the first embodiment.

FIG. 3 is a flow chart illustrating a control method of the electrostatic capacitance sensor 100 according to the first embodiment. A flow chart of FIG. 3 illustrates a control flow at the time of operation for opening and closing the electrostatic capacitance sensor electrode 110 by the user while idling or moving of the opening and closing body 150. Also, the flow chart is illustrated in which the flow starts from "START" and terminates at "END"; however, since the user operates at irregular timing, the control flow is preferably performed successively or intermittently. However, the control flow may be stopped under a circumstance in which the opening and closing body 150 is not opened or closed while driving.

In Step S301, the determination section 123 determines whether the opening and closing body 150 is in motion or idle, based on a signal indicating a state of the opening and closing body 150, which is input from the opening and closing body control device 140 through the control signal inputting and outputting section 127. When it is determined that the opening and closing body is idle, the flow proceeds to Step S302 ("while idling" in Step S301), and when it is determined that opening and closing body is operated, the flow proceeds to Step S305 ("while in motion" in Step S301). The opening and closing motion signal includes at least information relating to that the opening and closing body 150 is in motion or idle. In addition, the signal may include position information, velocity information, and acceleration information of the opening and closing body 150, and a determination in Step S301 may be performed based on one or multiple information items among these information items. Also, these information items included in the opening and closing motion signal can be obtained by measuring a rotation state of the motor using a pulse sensor, or the like included in the motor for moving the opening and closing body 150.

In Step S302, the electrostatic capacitance sensor 100 is operated in a mode of detecting the gesture operation of the user. Specifically, the capacitance measurement section 130 alternately repeatedly performs a measurement of a capacitance value (first capacitance value) between the transmission electrode 111 and the first reception electrode 112, and a measurement of a capacitance value (second capacitance value) between the transmission electrode 111 and the second reception electrode 113, and a measurement result is stored in the memory 125. The determination section 123 determines whether a time change between the first capacitance value and the second capacitance value stored in the memory 125 coincides with a predetermined pattern defined as a gesture operation.

A predetermined gesture operation for moving the opening and closing body 150 is assumed to be a case in which "the user brings his or her hand close to the first reception electrode 112 and then to the second reception electrode 113". When the user performs the gesture operation, time change of the capacitance value, such as a case in which the first capacitance value is reduced, and then the second capacitance value is reduced, occurs. When such a time change of the capacitance value is detected, the determination section 123 can determine that the user intends to move the opening and closing body 150 by the predetermined gesture operation. That is, in Step S303, when the time change of the first capacitance value and the second capacitance value coincides with a predetermined pattern, the determination section 123 determines that the user performs the operation, and the flow proceeds to Step S304 ("YES" in Step S303). Otherwise, the determination section 123 determines that the user does not perform the operation, and the flow is terminated ("NO" in Step S303). Moreover, the operation of "bringing the hand close to" in the above described gesture operation may be a motion (touching) which the hand comes into contact with the electrode. That is, the gesture operation for moving the opening and closing body 150 may be an operation that "the user touches the first reception electrode 112 and then touches the second reception electrode 113."

In Step S304, the determination section 123 outputs the signal, which indicates that the user performs an operation for opening or closing, to the opening and closing body control device 140. Accordingly, the opening and closing body control device 140 controls the opening motion or the closing motion of the opening and closing body 150. Moreover, as an example of a method for determining that either opening motion or closing motion is performed, the closing motion can be performed when the opening and closing body 150 is opened, and the opening motion can be performed when the opening and closing body 150 is closed. In addition, the operation of opening motion or closing motion may be performed by other gestures, and the operation of opening motion or closing motion may be performed by other sensors. When the opening motion or closing motion is performed, the flow is terminated.

Meanwhile, when it is determined as "while in motion" in Step S301, the electrostatic capacitance sensor 100 is operated in a mode in which a touching operation by the user is detected in Step S305. Specifically, the capacitance measurement section 130 repeatedly performs a measurement of the capacitance value (first capacitance value) between the transmission electrode 111 and the first reception electrode 112, and a measurement of the capacitance value (second capacitance value) between the transmission electrode 111 and the second reception electrode 113, and then the measurement result is stored in the memory 125. The determination section 123 determines that whether the first capacitance value or the second capacitance value stored in the memory 125 is changed to be equal to or more than a predetermined threshold is detected.

When either the first capacitance value or the second capacitance value is changed to be equal to or more than the predetermined threshold, the determination section 123 can determine that the user intends to move the opening and closing body 150 by touching the electrostatic capacitance sensor electrode 110 with his or her hand (or bringing the hand or the like closer to the electrode closer than a predetermined distance). That is, in Step S306, when at least one of the first capacitance value and the second capacitance value is changed to be equal to or more than the predetermined threshold, the determination section 123 determines that the user performs the operation, and the flow proceeds to Step S307 ("YES" in Step S306). Otherwise, the determination section 123 determines that the user does not perform operation, and the flow proceeds to Step S308 ("NO" in Step S306). Also, a condition described above may be transformed to a case in which "a state in which the capacitance value is changed to be equal to or more than the predetermined threshold is maintained for a predetermined time T2 or more". For example, it is most suitable that the time T2 is set to be 0.1 seconds or shorter, which is sufficiently shorter than the operation time of the opening and closing body 150. When the condition is transformed as described above, the erroneous detection, which is possibly generated when the capacitance value is instantly changed due to the noise, can be reduced.

Moreover, as a determination condition in Step S306, at least one of the first capacitance value and the second capacitance value may be changed as described above, or both of them may be changed. In addition, only one of the first capacitance value and the second capacitance value may be obtained, and the determination may be performed based on the obtained value. However, it is most suitable to determine that the operation has been performed when both the first capacitance value and the second capacitance value are obtained, and one of them is changed. This is because when the capacitance values obtained using many electrodes are used for a determination, a range in which detection is possible is widened, and a stop operation at the time of moving the opening and closing body 150 is more easily performed.

In Step S307, the determination section 123 outputs a signal, which indicates that the user performs an operation for stopping the motion of the opening and closing body 150, to the opening and closing body control device 140. Accordingly, the opening and closing body control device 140 performs control to stop the opening and closing body 150. When the control is performed to stop the body, the flow is terminated.

Meanwhile, when determining that the user does not perform the operation, in Step S308, the determination section 123 determines whether the opening and closing body 150 is in a fully opened state or a fully closed state based on position information or the like of the opening and closing body 150 which is input from the opening and closing body control device 140. When the opening and closing body 150 is in the fully opened state or the fully closed state, the opening and closing operation cannot be performed anymore, and thus the flow proceeds to Step S307 ("YES" in Step S308). In the same manner, controlling for stopping the opening and closing body 150 is performed, and the flow is terminated. When the opening and closing body is not in the fully opened state or a fully closed state, the determination section 123 determines that the opening motion or closing motion may continue, and the flow is terminated ("NO" in Step S308).

Hitherto, according to the embodiment, since the user performs touching operation while the opening and closing body 150 is in motion, an operation can be performed in a short time. Accordingly, the operation can be performed in a short time under a circumstance in which the opening and closing body 150 needs to be stopped quickly such as a case in which an object is pinched in the opening and closing body 150, or a case in which the opening and closing body 150 hits a wall.

In addition, when the electrostatic capacitance sensor electrode 110 is mounted on the movable member of the opening and closing body 150 (on the sliding door, on the back door, or the like), the electrostatic capacitance sensor electrode 110 itself is also moved while the opening and closing body 150 is in motion, and thus there is a problem in that an operation using a gesture is hard to be performed. However, according to the embodiment, even in this case, the operation can be easily performed in a short time using a touching operation.

Because of at least one reason among the above described descriptions, according to the embodiment, the operation can be performed in a short time while the opening and closing body 150 is moved. Accordingly, a stopping operation can be performed in a short time in a case in which the object may be pinched in the opening and closing body 150, or a case in which the opening and closing body 150 may hit the wall. Meanwhile, since the user can perform the gesture operation while the opening and closing body 150 is idle, the erroneous detection is also reduced.

Moreover, in the description of the embodiment described above, the number of reception electrodes included in the electrostatic capacitance sensor electrode 110 is set to two; however, the embodiment disclosed here can be also applied to a case in which the number of electrodes is set to three or more. In a case in which the number of the reception electrodes is three or more, the number of the reception electrodes used for the touching operation may be set to more than the number of the reception electrodes used for the gesture operation. For example, when three reception electrodes are provided, the number of the reception electrodes used for the gesture operation is set to only two, and the number of the reception electrodes used for the touching operation can be set to three. Accordingly, the erroneous detection can be reduced by narrowing the range in which detection is possible while the opening and closing body 150 is idle, otherwise, the operation can be easily performed by widening the range in which detection is possible while the opening and closing body 150 is in motion.

Second Embodiment

In the first embodiment, the operation method while the opening and closing body 150 is idle is a gesture operation by the user. In contrast, in a second embodiment, the user performs an operation of holding his or her hand over the electrostatic capacitance sensor electrode 110 at a predetermined time (hereinafter, referred to as holding operation). A detection method or a detection condition of the electrostatic capacitance sensor 100 of the embodiment is transformed so as to be capable of detecting the holding operation.

Figure 4:
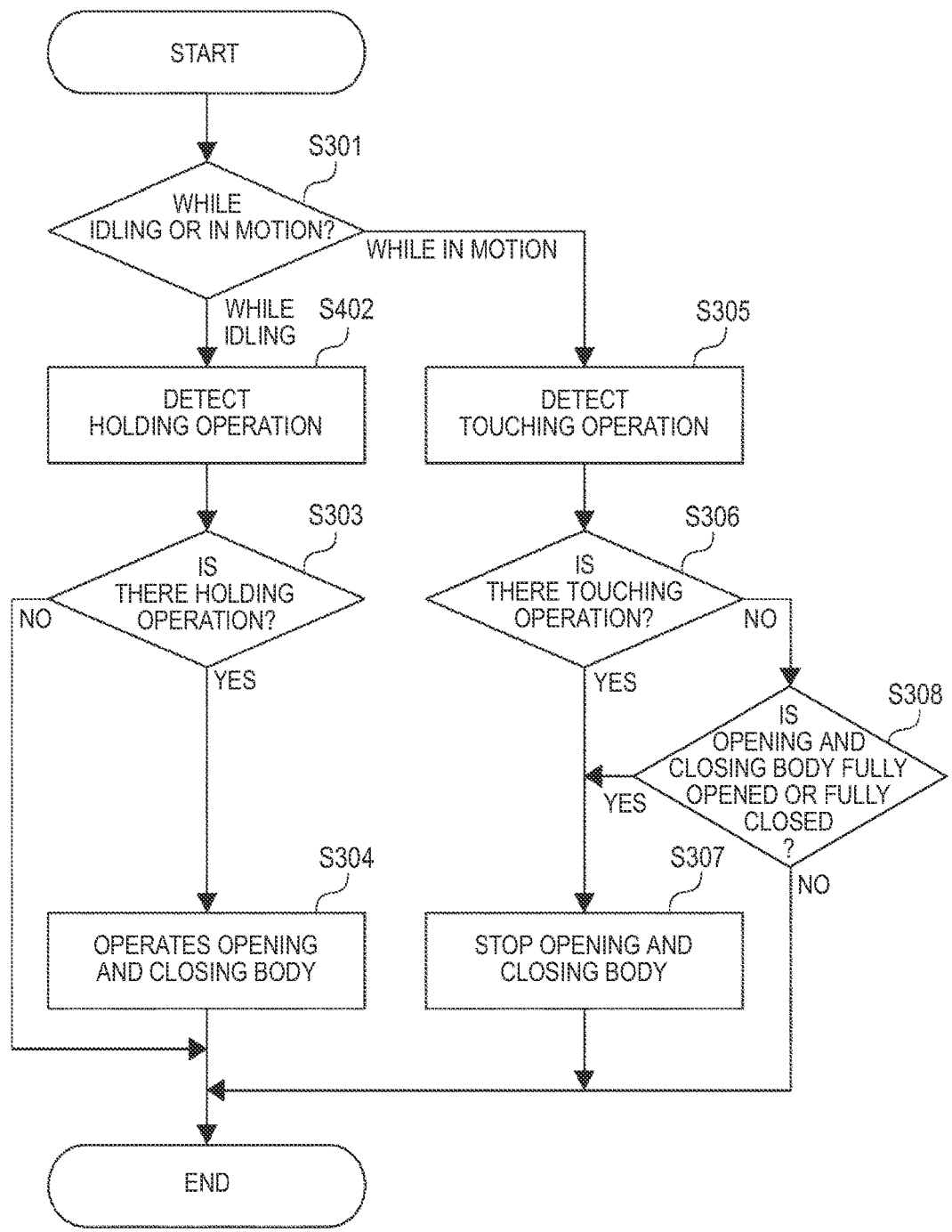
FIG. 4 is a flow chart illustrating a control method of an electrostatic capacitance sensor according to a second embodiment.

FIG. 4 is a flow chart illustrating a control method of the electrostatic capacitance sensor 100 according to the second embodiment. Description of steps same as that of the first embodiment will not be repeated.

In Step S402, the electrostatic capacitance sensor 100 is operated in a mode in which the holding operation by the user is detected. Specifically, the capacitance measurement section 130 alternately repeatedly performs the measurement of the capacitance value (first capacitance value) between the transmission electrode 111 and the first reception electrode 112, and the measurement of the capacitance value (second capacitance value) between the transmission electrode 111 and the second reception electrode 113, and the measurement result is stored in the memory 125. The determination section 123 determines that the user performs the operation in a case in which a state in which the first capacitance value or the second capacitance value stored in the memory 125 is changed to a predetermined threshold or more is maintained for the time T1 or more.

Here, when a determination condition of the touching operation in Step S305 is "a case in which a state in which the capacitance value is changed to the predetermined threshold or more is maintained for a predetermined time T2 or more", the time T1 in the detection condition of the holding operation is set to be longer than the time T2 in the detection condition of the touching operation. For example, it is preferable that the time T1 is set to one second or longer, and the time T2 is set to 0.1 seconds or shorter. By setting a time for detecting the holding operation sufficiently long, the erroneous detection due to water wetting, a passing human, or the like can be reduced. In addition, since time necessary for the touching operation can be sufficiently reduced, the operation can be performed in a short time while the opening and closing body 150 is in motion in the same manner as the first embodiment.

Moreover, as an operation method in the embodiment, an example of the holding operation of the user with his or her hand is described; however, the operation method is not limited to the holding operation. An operation method of bringing the foot, body, or the like other than the hand close to the electrostatic capacitance sensor electrode 110 may be used, or an operation of bringing an object such as a burden close thereto may be possible. For example, when the electrostatic capacitance sensor electrode 110 is provided near a bumper of the vehicle, a configuration in which the operation is performed using the foot may be used.

The gesture operation of the first embodiment and the holding operation of the second embodiment are different in measurement control in the measurement control section 122 and a determination condition in the determination section 123. When these functions are provided using software, hardware constituting the electrostatic capacitance sensor 100 may be the same. In this case, in accordance with the operation by the user, the detection method when the opening and closing body 150 is idle may be switched to either the gesture operation or holding operation. Accordingly, an operation method matching a taste of the user can be provided.

Third Embodiment

Figure 5:
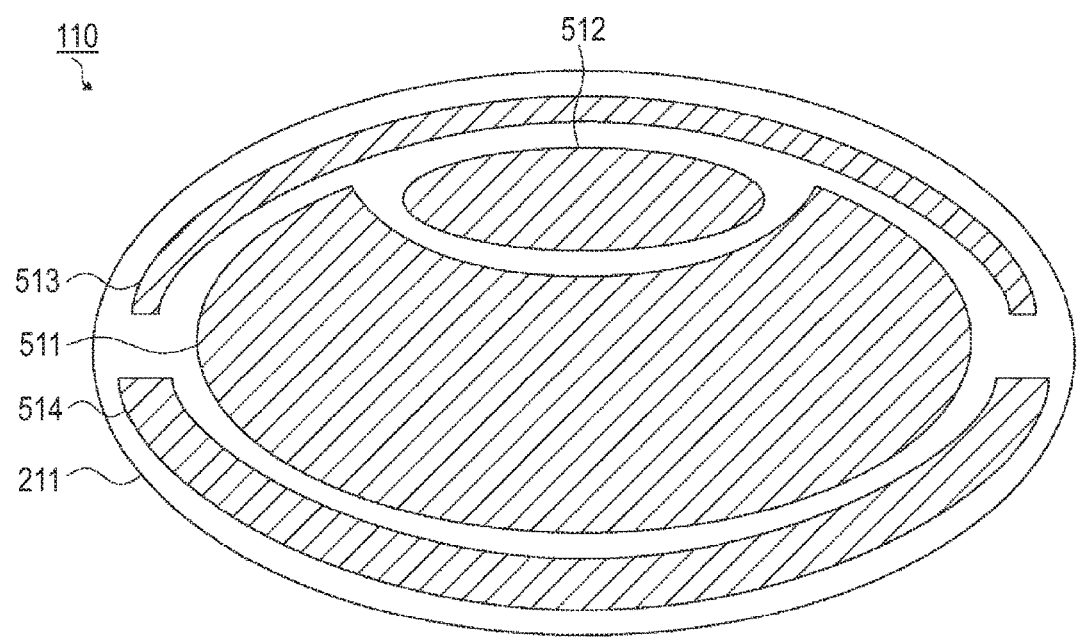
FIG. 5 is a view illustrating a configuration of an electrostatic capacitance sensor electrode according to a third embodiment.

FIG. 5 is a view illustrating a configuration of the electrostatic capacitance sensor electrode 110 according to a third embodiment. The electrostatic capacitance sensor electrode 110 includes a transmission electrode 511, a detection electrode 512, a raindrop detection electrode 513, and a detection area limitation electrode 514, which are provided on one main surface of the base body 211. The base body 211 has an ellipse shape. The detection electrode 512 is an ellipse shape electrode which is disposed on an upper side further than a longer axis of the base body 211. The base body 211 and the detection electrode 512 are disposed such that their longer axes and shorter axes coincide with each other. The raindrop detection electrode 513 is an elongate shape electrode which is disposed to pass between the detection electrode 512 and an upper end of the base body 211 along the upper end of the base body 211. The detection area limitation electrode 514 is an elongate shape electrode which is disposed along a lower end of the base body 211. The transmission electrode 511 is an electrode which is disposed between the detection electrode 512, the raindrop detection electrode 513, and the detection area limitation electrode 514, and disposed near the center of the base body 211. In addition, such an arrangement is not necessary, and may be transformed variously.

The electrostatic capacitance sensor of the embodiment is a mutual capacitance type electrostatic capacitance sensor same as that of the first embodiment and the second embodiment. The transmission electrode 511 corresponds to the transmission electrode 111 of the first embodiment and the second embodiment. The detection electrode 512, the raindrop detection electrode 513, and the detection area limitation electrode 514 correspond to the first reception electrode 112 or the second reception electrode 113 of the first embodiment and the second embodiment. A configuration of other parts such as the electrostatic capacitance sensor control section 120 is the same as that of the first embodiment and the second embodiment.

The electrostatic capacitance sensor of the embodiment can perform the touching operation and the holding operation using the detection electrode 512 in the same manner as the first embodiment and the second embodiment. In addition, the electrostatic capacitance sensor of the embodiment includes the raindrop detection electrode 513 and the detection area limitation electrode 514. All the detection electrode 512, the raindrop detection electrode 513, and the detection area limitation electrode 514 function as a reception electrode for the mutual capacitance type electrostatic capacitance sensor.

When liquid such as raindrops flows out from an upper side of the electrostatic capacitance sensor electrode 110, the liquid comes into contact with the raindrop detection electrode 513, and then comes into contact with the detection electrode 512. At this time, not only the capacitance value between the transmission electrode 511 and the detection electrode 512, but also the capacitance value between the transmission electrode 511 and the raindrop detection electrode 513 are reduced. By measuring these values, it is possible to determine whether there is an erroneous detection in the capacitance change between the transmission electrode 511 and the detection electrode 512 due to the raindrops.

When a large object (human, wall, or the like) is near the electrostatic capacitance sensor electrode 110, not only the capacitance value between the transmission electrode 511 and the detection electrode 512, but also the capacitance value between the transmission electrode 511 and the detection area limitation electrode 514 are reduced. In this case, the determination section 123 can determine that the capacitance change is not a normal operation, and there is an erroneous detection. Accordingly, it is possible to determine whether the capacitance change between the transmission electrode 511 and the detection electrode 512 is an erroneous detection due to the large object near the electrostatic capacitance sensor electrode 110.

Meanwhile, when the human intends to operate the detection electrode 512 and performs the touching operation (or holding operation), neither the capacitance value between the transmission electrode 511 and the raindrop detection electrode 513 and the capacitance value between the transmission electrode 511 and the detection area limitation electrode 514 are increased, or these are sufficiently small changes compared to a change of the capacitance value between the transmission electrode 511 and the detection electrode 512. In this case, the operation can be determined as the normal operation, not the erroneous detection.

Figure 6:
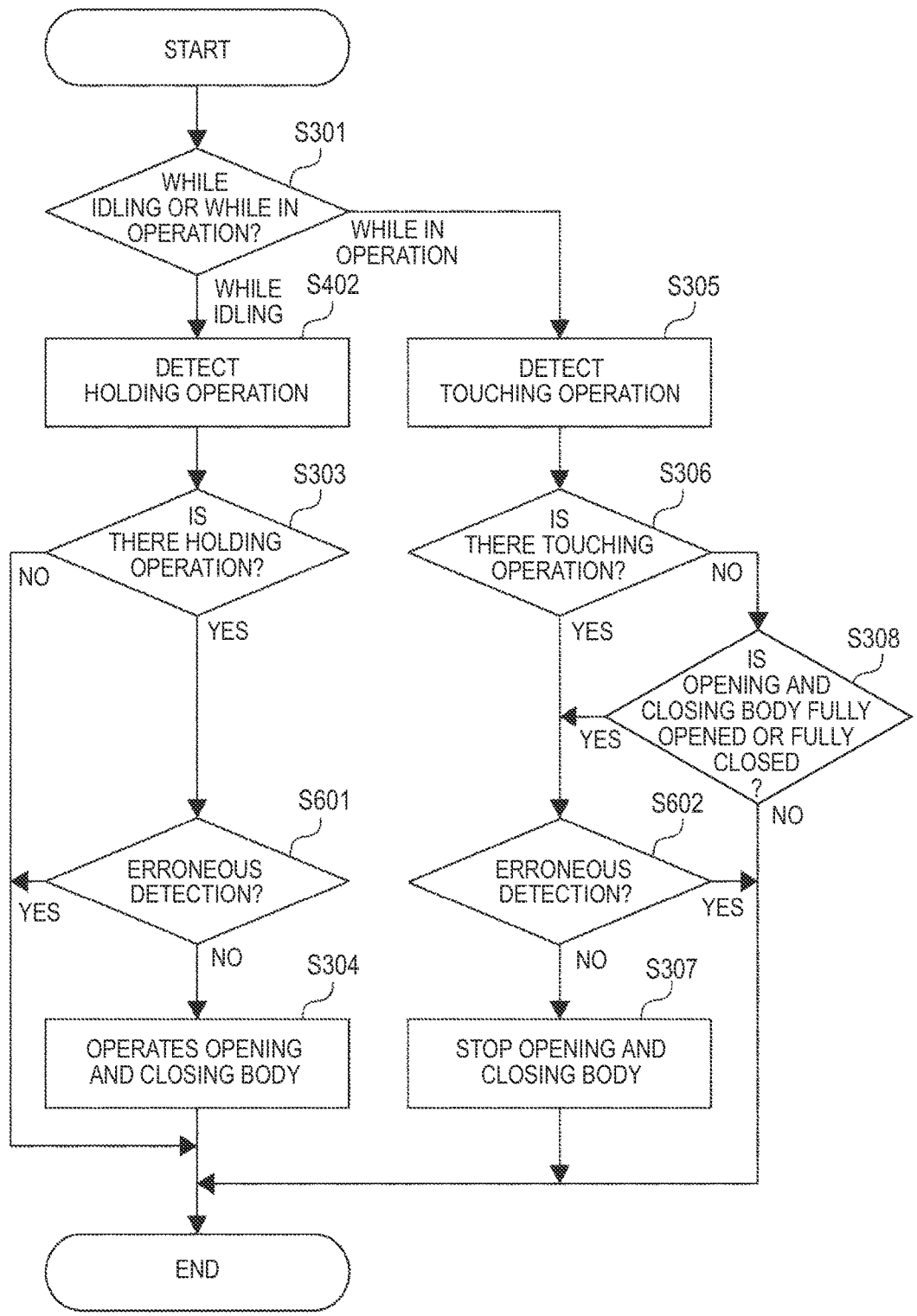
FIG. 6 is a flow chart illustrating a control method of the electrostatic capacitance sensor according to the third embodiment.

FIG. 6 is a flow chart illustrating a control method of the electrostatic capacitance sensor 100 according to the third embodiment. In the embodiment, Step S601 is inserted between Step S303 and Step S304, and Step S602 is inserted between Step S306 and Step S307. Description of steps same as that of the first embodiment and the second embodiment will not be repeated.

In Step S601, the electrostatic capacitance sensor 100 detects the holding operation by the user using the raindrop detection electrode 513 and the detection area limitation electrode 514. Specifically, the capacitance measurement section 130 and the calculation section 124 repeatedly performs a measurement of the capacitance value (third capacitance value) between the transmission electrode 511 and the raindrop detection electrode 513 and a measurement of the capacitance value (fourth capacitance value) between the transmission electrode 511 and the detection area limitation electrode 613, and the measurement result is stored in the memory 125. The determination section 123 determines that there is an erroneous detection in a case in which a state of changing the third capacitance value stored in the memory 125 to be equal to or more than a predetermined threshold continues for a predetermined time T3 or more, or a case in which a state of changing the fourth capacitance value to be equal to or more than a predetermined threshold continues for a predetermined time T4 or more. When it is determined that there is an erroneous detection, the flow is terminated ("YES" in Step S601). Otherwise, the flow proceeds to Step S304 ("NO" in Step S601).

The same determination is performed in Step S602, and when it is determined that there is an erroneous detection, the flow is terminated ("YES" in Step S602). Otherwise, the flow proceeds to Step S307 ("NO" in Step S602).

The self capacitance type electrostatic capacitance sensor 100 of the embodiment can perform the touching operation and the holding operation using the detection electrode 512 in the same manner that of the first embodiment and the second embodiment. Accordingly, the same effects are obtained. In addition, since the electrostatic capacitance sensor of the embodiment includes the raindrop detection electrode 513 and the detection area limitation electrode 514, a possibility of an erroneous detection due to liquid such as raindrops and a large object positioned near there can be reduced.

Fourth Embodiment

In the description of the first embodiment to the third embodiment, the mutual capacitance type electrostatic capacitance sensor is exemplified; however, the electrostatic capacitance sensor may be of a self capacitance type. Hereinafter, the self capacitance type electrostatic capacitance sensor is exemplified as a fourth embodiment.

Figure 7A:
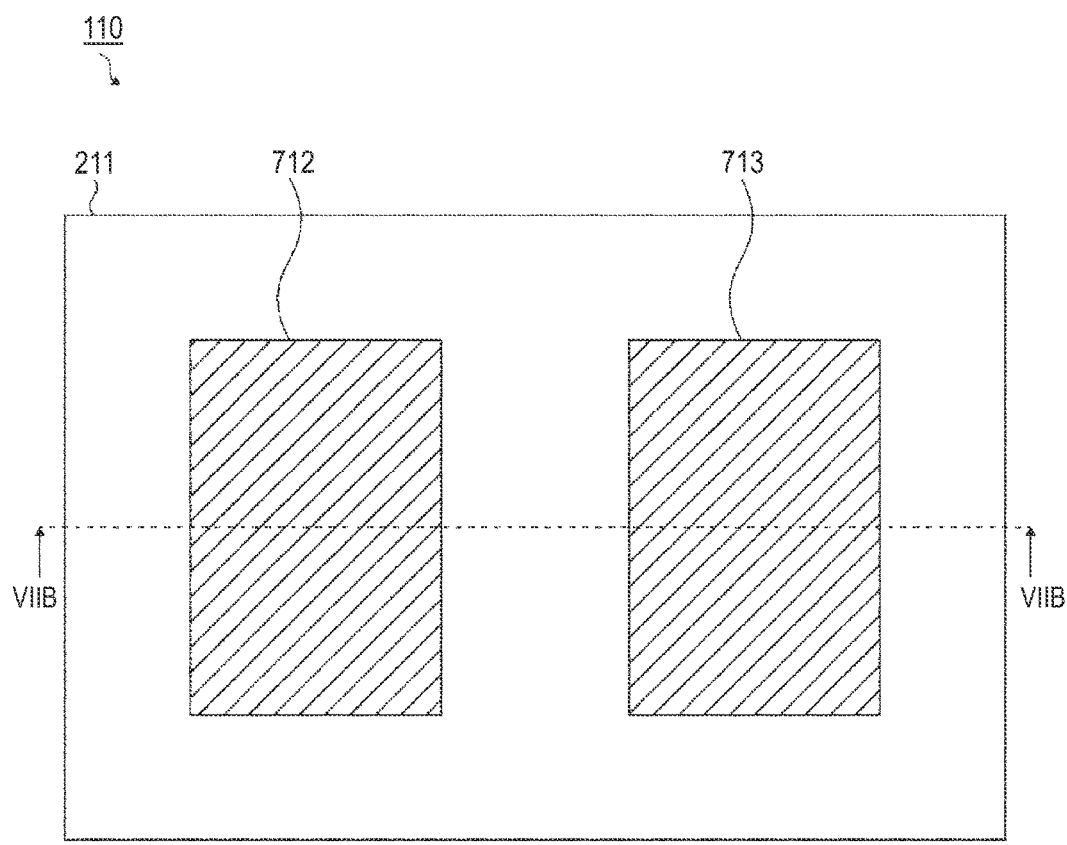
FIG. 7A is a view illustrating a configuration of an electrostatic capacitance sensor electrode according to a fourth embodiment.
Figure 7B:
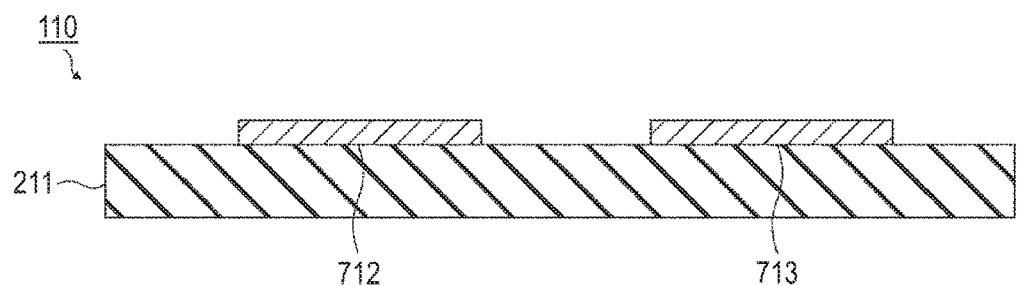
FIG. 7B is a sectional view taken along the line VIIB-VIIB, which illustrates the electrostatic capacitance sensor electrode according to the fourth embodiment.

FIG. 7A is a view illustrating a configuration of the electrostatic capacitance sensor electrode 110 according to the fourth embodiment. In addition, FIG. 7B is a sectional view taken along the line VIIB-VIIB, which illustrates the electrostatic capacitance sensor electrode according to the fourth embodiment. The electrostatic capacitance sensor electrode 110 includes a first detection electrode 712 and a second detection electrode 713 which are formed on the base body 211. The first detection electrode 712 and the second detection electrode 713 are disposed side by side on a same surface of the base body 211. Moreover, this arrangement is not necessary, and for example, a shape may be adopted in which one detection electrode surrounds the other detection electrode, or one detection electrode may be larger than the other detection electrode.

Figure 7C:
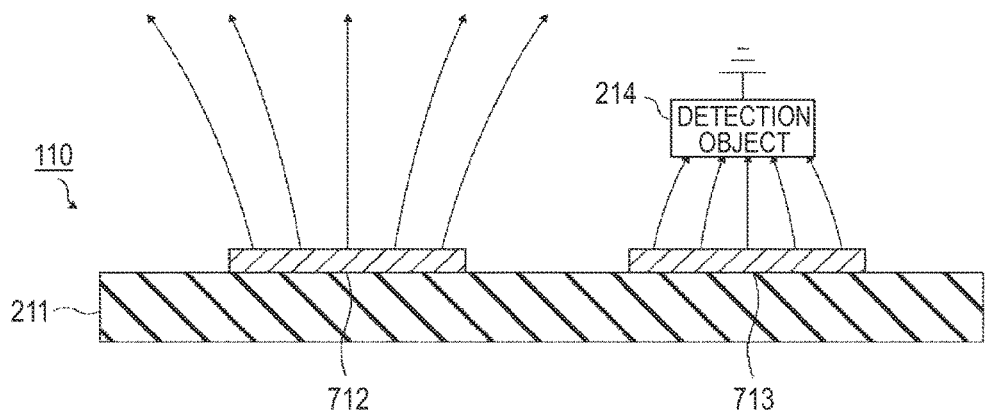
FIG. 7C is a view illustrating a detection of a capacitance change using the electrostatic capacitance sensor electrode according to the fourth embodiment.

FIG. 7C illustrates a distribution of the electric force line when the detection object 214 having conductivity such as human's hand approaches the second detection electrode 713. The detection object 214 equivalently functions as a ground. For this reason, a part of the electric force line output from the second detection electrode 713 is absorbed into the detection object 214. Accordingly, the electrostatic capacitance generated by the second detection electrode 713 increases. Approaching of the detection object 214 can be detected by measuring the increase of the electrostatic capacitance through the second detection electrode 713. The same applies to a case in which the detection object 214 approaches the first detection electrode 712. That is, the electrostatic capacitance sensor electrode 110 of the embodiment includes two detection regions, and can measure by two channels. Moreover, the number of electrodes is changed, and thus the number of measurement channels can be changed. That is, the number of the electrodes may not be two, but may be one or three or more.

The self capacitance type electrostatic capacitance sensor 100 of the embodiment can perform the gesture operation, the touching operation, and the holding operation in the same manner as the first embodiment and the second embodiment. Accordingly, even when the self capacitance type electrostatic capacitance sensor 100 is used, controlling can be performed in the same manner as the first embodiment and the second embodiment, and the same effects are obtained. In addition, the electrostatic capacitance sensor of the third embodiment may be transformed to the self electrostatic capacitance sensor in the same manner as the embodiment by omitting the transmission electrode 511.

Fifth Embodiment

The electrostatic capacitance sensor electrode 110 according to each of the embodiments described above can be mounted inside an exterior surface of the emblem which is provided on the vehicle.

Figure 8:
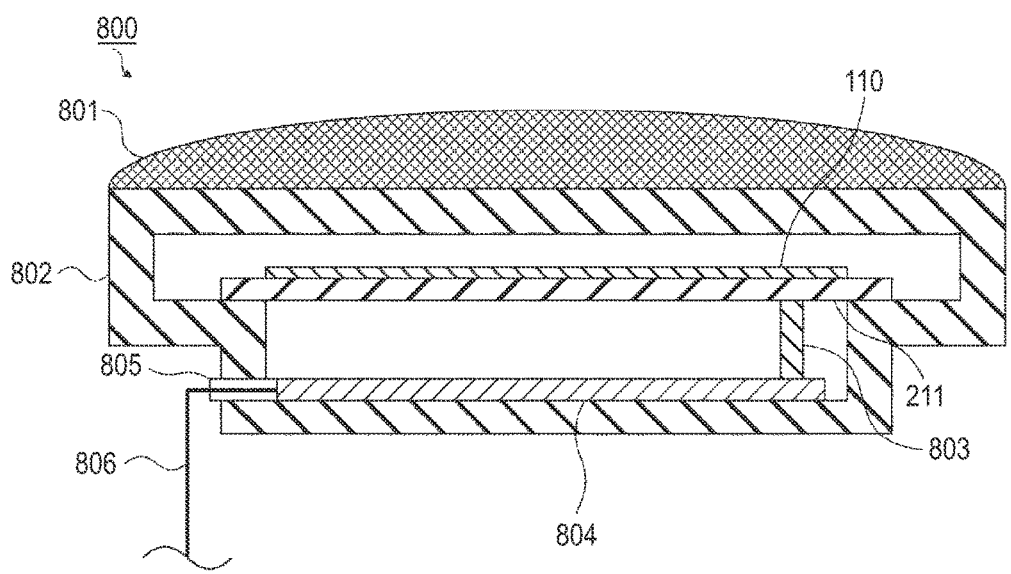
FIG. 8 is a sectional view of an emblem including an electrostatic capacitance sensor electrode according to a fifth embodiment.

FIG. 8 is a sectional view of the emblem including the electrostatic capacitance sensor electrode according to a fifth embodiment. The emblem 800 includes an exterior surface 801, a base section 802, the base body 211 on which the electrostatic capacitance sensor electrode 110 is formed, a connection section 803, a control circuit substrate 804, a connector 805, and a harness 806. The exterior surface 801 is a surface on which a design indicating a vehicle manufacturer, a vehicle model, or the like is formed. The exterior surface 801 is formed of an insulation body such as resin, as a main material so as not to inhibit the electric force line output from the electrostatic capacitance sensor electrode 110. The base section 802 is provided with the exterior surface 801 on its surface, and functions as a case which is provided with the base body 211 on which the electrostatic capacitance sensor electrode 110 is formed, the connection section 803, and the control circuit substrate 804 therein, and protects these sections. The connection section 803 is a member which electrically connects the electrostatic capacitance sensor electrode 110 to the control circuit substrate 804. The control circuit substrate 804 is a circuit component including an integrated circuit (IC). The control circuit substrate 804 may include a part or the entire of a function of the electrostatic capacitance sensor control section 120. The connector 805 is a member which connects the control circuit substrate 804 to the harness 806 for inputting and outputting an electrical signal to outside of the base section 802. The harness 806 is connected to an electronic control section (ECU) of the vehicle, power source, or the like.

Figure 9:
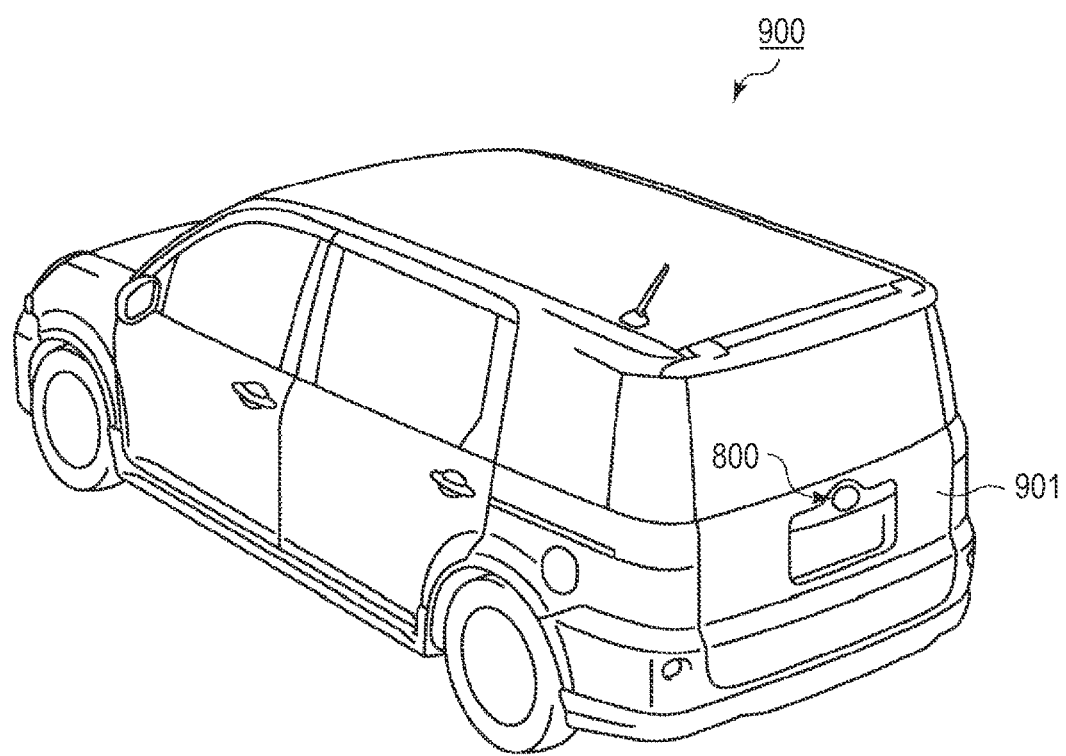
FIG. 9 is a view illustrating an example in which the emblem according to the fifth embodiment is attached to a vehicle.

FIG. 9 is a view illustrating an example in which the emblem according to the fifth embodiment is attached to the vehicle. The vehicle 900 includes a back door 901. In the center of the back door 901, the emblem 800 which includes the electrostatic capacitance sensor electrode 110 therein is provided. In the embodiment, the emblem 800 which is an operating section is mounted on the back door 901 which is a movable member of the opening and closing body to be moved. In order for the user to intuitively perform the operation, the operating section is preferably provided on the movable member of the opening and closing body as described above. A place for mounting the emblem 800 is arbitrary, and the emblem 800 for operating other opening and closing bodies such as a sliding door, a power window, a sun roof, or a swing door may be provided.

Since the emblem 800 of the embodiment is provided with the electrostatic capacitance sensor electrode 110 therein, the emblem functions as a detecting section for controlling in the first embodiment to the fourth embodiment. Therefore, the emblem 800 of the embodiment includes a function of a decoration for display which notifies the user of presence and location of the detecting section, in addition to a function of displaying a vehicle manufacturer, a vehicle model, or the like.

An aspect of this disclosure provides an operation detecting device of an opening and closing body for a vehicle including a detecting section that detects an operation by a user with respect to an opening and closing body of a vehicle, an input section that receives an opening and closing body motion signal which indicates whether the opening and closing body is in motion or idle, a determination section that determines whether the operation is performed using different detection conditions for a case in which the opening and closing body is in motion and a case in which the opening and closing body is idle, and an output section that outputs a control signal which causes the opening and closing body to move or stop based on the determination result of the determination section.

In the operation detecting device of an opening and closing body for a vehicle according to the aspect of this disclosure, the detecting section may include at least one electrode for detecting a change of an electrostatic capacitance value which is generated due to the operation, and the determination section may determine whether or not the operation is performed, based on the change of the electrostatic capacitance value.

In the operation detecting device of an opening and closing body for a vehicle according to the aspect of this disclosure, the detecting section may include a plurality of electrodes, when the opening and closing body is idle, the determination section may determine that the operation is performed in a case in which a plurality of the electrostatic capacitance values detected by the plurality of electrodes shows a variation pattern corresponding to a predetermined gesture of the user, and, when the opening and closing body is in motion, the determination section may determine that the operation is performed in a case where it is detected that at least one of the plurality of electrostatic capacitance values detected by the plurality of electrodes is changed to a predetermined threshold or more due to the operation.

In the operation detecting device of an opening and closing body for a vehicle according to the aspect of this disclosure, when the opening and closing body is in motion, the detecting section may determine whether or not the operation is performed based on the electrostatic capacitance values detected by a larger number of electrodes than when the opening and closing body is idle.

In the operation detecting device of an opening and closing body for a vehicle according to the aspect of this disclosure, when the opening and closing body is idle, the detecting section may determine that the operation is performed in a case where it is detected that a state in which the electrostatic capacitance value is changed to a predetermined threshold or more due to the operation continues for a first time or more, and, when the opening and closing body is in motion, the detecting section may determine that the operation is performed in a case where it is detected that a state in which the electrostatic capacitance value is changed to a predetermined threshold or more due to the operation continues for a second time or more which is shorter than the first time.

In the operation detecting device of an opening and closing body for a vehicle according to the aspect of this disclosure, when the detecting section determines that the operation is performed while the opening and closing body is in motion, the output section may output the control signal which causes the opening and closing body to be idle.

According to the aspect of this disclosure, an operation detecting device of an opening and closing body for a vehicle which can perform the operation in a short time while the opening and closing body is in motion is provided.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An operation detecting device of an opening and closing body for a vehicle, comprising:
  a detecting section that detects an operation by a user with respect to an opening and closing body of a vehicle, the detecting section includes a plurality of electrodes which detect a change of an electrostatic capacitance value which is generated due to the operation;
  an input section that receives an opening and closing body motion signal which indicates whether or not the opening and closing body is in motion or idle;
  a determination section that determines whether or not the operation is performed using different detection conditions for a case in which the opening and closing body is in motion and a case in which the opening and closing body is idle; and
  an output section that outputs a control signal which causes the opening and closing body to move or stop based on the determination result of the determination section;
  wherein,
  the determination section determines whether or not the operation is performed, based on the change of the electrostatic capacitance value,
  when the opening and closing body is idle, the determination section determines that the operation is performed in a case in which a plurality of the electrostatic capacitance values detected by the plurality of electrodes shows a variation pattern corresponding to a predetermined gesture of the user, and
  when the opening and closing body is in motion, the determination section determines that the operation is performed in a case where it is detected that at least one of the plurality of electrostatic capacitance values detected by the plurality of electrodes is changed to a predetermined threshold or more due to the operation.

2. The operation detecting device of an opening and closing body for a vehicle according to claim 1
  wherein, when the opening and closing body is in motion, the detecting section determines whether or not the operation is performed based on the electrostatic capacitance values detected by a larger number of electrodes than when the opening and closing body is idle.

3. The operation detecting device of an opening and closing body for a vehicle according to claim 1,
wherein, when the detecting section determines that the operation is performed while the opening and closing body is in motion, the output section outputs the control signal which causes the opening and closing body to be idle.

4. An operation detecting device of an opening and closing body for a vehicle, comprising:
- a detecting section that detects an operation by a user with respect to an opening and closing body of a vehicle, the detecting section includes a plurality of electrodes which detect a change of an electrostatic capacitance value which is generated due to the operation;
- an input section that receives an opening and closing body motion signal which indicates whether or not the opening and closing body is in motion or idle;
- a determination section that determines whether or not the operation is performed using different detection conditions for a case in which the opening and closing body is in motion and a case in which the opening and closing body is idle; and
- an output section that outputs a control signal which causes the opening and closing body to move or stop based on the determination result of the determination section;

wherein, the determination section determines whether or not the operation is performed, based on the change of the electrostatic capacitance value, when the opening and closing body is idle, the detecting section determines that the operation is performed in a case where it is detected that a state in which the electrostatic capacitance value is changed to a predetermined threshold or more due to the operation continues for a first time or more, and when the opening and closing body is in motion, the detecting section determines that the operation is performed in a case where it is detected that a state in which the electrostatic capacitance value is changed to a predetermined threshold or more due to the operation continues for a second time or more which is shorter than the first time.

* * * * *